(12) United States Patent
Nakatani (10) Patent No.: US 7,780,876 B2
(45) Date of Patent: Aug. 24, 2010

(54) FINE METAL PARTICLE COLLOIDAL SOLUTION, CONDUCTIVE PASTE MATERIAL, CONDUCTIVE INK MATERIAL, AND PROCESS FOR PRODUCING THE SAME

(75) Inventor: Isao Nakatani, Ibaraki (JP)

(73) Assignee: National Institute for Materials Science, Ibaraki (JP)

( * ) Notice: Subject to any disclaimer, the term of this patent is extended or adjusted under 35 U.S.C. 154(b) by 404 days.

(21) Appl. No.: 11/578,575

(22) PCT Filed: Apr. 18, 2005

(86) PCT No.: PCT/JP2005/007739

§ 371 (c)(1),
(2), (4) Date: Jan. 12, 2007

(87) PCT Pub. No.: WO2005/099941

PCT Pub. Date: Oct. 27, 2005

(65) Prior Publication Data

US 2008/0277629 A1    Nov. 13, 2008

(30) Foreign Application Priority Data

Apr. 16, 2004  (JP)  .............................. 2004-122043

(51) Int. Cl.
*H01B 1/22* (2006.01)
(52) U.S. Cl. ....................... 252/512; 252/513; 252/514; 428/546; 428/402
(58) Field of Classification Search ................. 252/512, 252/513, 514; 428/546, 402
See application file for complete search history.

(56) References Cited

U.S. PATENT DOCUMENTS

| | | | | |
|---|---|---|---|---|
| 4,599,184 A | * | 7/1986 | Nakatani et al. | 252/62.51 R |
| 5,137,652 A | * | 8/1992 | Nakatani et al. | 252/62.51 R |
| 5,180,512 A | * | 1/1993 | Nakatani et al. | 252/62.51 R |
| 6,316,100 B1 | * | 11/2001 | Kodas et al. | 428/357 |
| 6,663,799 B2 | * | 12/2003 | Kokubo et al. | 252/512 |
| 6,679,937 B1 | * | 1/2004 | Kodas et al. | 75/365 |
| 7,081,214 B2 | * | 7/2006 | Matsuba et al. | 252/512 |
| 7,186,398 B2 | * | 3/2007 | Andres et al. | 424/9.1 |
| 7,462,303 B2 | * | 12/2008 | Miura | 252/513 |
| 7,470,416 B2 | * | 12/2008 | Ishida | 423/403 |
| 7,494,710 B2 | * | 2/2009 | Ishihara et al. | 428/402 |
| 2008/0105853 A1 | * | 5/2008 | Ueda et al. | 252/513 |

FOREIGN PATENT DOCUMENTS

| | | |
|---|---|---|
| EP | 1 340 568 | 9/2003 |
| JP | 3-262504 | 11/1991 |
| JP | 2002-60805 | 2/2002 |
| JP | 2002-121606 | 4/2002 |

OTHER PUBLICATIONS

English Translation of JP 2002-060805, Feb. 28, 2002.*
English translation of JP 2002-121606, Apr. 26, 2002.*
English translation of JP 3-262504, Nov. 22, 1991.*
I. Nakatani et al., "Preparation and Magnetic Properties of Colloidal Ferromagnetic Metals", Journal of Magnetism and Magnetic Materials, 65, pp. 261-264, 1987.
I. Nakatani, "Synthesis of High-performance Magnetic Fluids and Their Magnetic Properties", Third International Conference on Flow Dynamics, title page and pp. 99-100, Nov. 7-9, 2006.

* cited by examiner

*Primary Examiner*—Douglas Mc Ginty
(74) *Attorney, Agent, or Firm*—Wenderoth, Lind & Ponack, L.L.P.

(57) ABSTRACT

A colloidal solution of fine particles of metal or alloy having an average grain size of 10 nm or more is provided which is heat treated to cause coloration, or a metal colloidal pigment having inherent color, a conductive paste material or a conductive ink for printed substrate electronic parts or the like based on a colloid prepared by dispersing fine metal particles at high concentration in a liquid is provided.

2 Claims, 3 Drawing Sheets

FINE METAL PARTICLE COLLOIDAL SOLUTION, CONDUCTIVE PASTE MATERIAL, CONDUCTIVE INK MATERIAL, AND PROCESS FOR PRODUCING THE SAME

TECHNICAL FIELD

The invention of the application concerns a colloidal solution in which fine metal particles are dispersed at a high concentration in a liquid and, more specifically, it relates to a metal colloidal pigment exhibiting inherent colors, or conductive paste material for printed board electronic circuit boards, etc., or a conductive ink material and a manufacturing method thereof.

BACKGROUND ART

Colloids in which fine particles of electroconductive substances such as metals or alloys are dispersed are generally colored intensely. A color of an object is exhibited by partial absorption of spectra of visible rays and since metal colloidal particles cause intense scatter simultaneously with absorption, coloration is remarkable. In a case of expressing the coloring property of a colloidal solution for a colloidal solution layer of a predetermined thickness by using a reciprocal of a minimal concentration at which coloration of the colloidal solution is observed, the coloring power of a gold sol is about 20,000 times as high as a divalent copper ion ($Cu^{2+}$). The color of the colloidal solution is different when it is observed as a transmission light and observed as a reflection light. For example, while it appears yellow when observed through a silver sol contained in a glass container, it appears blue when a reflection light is observed. Further, coloration of the colloidal solution changes also depending on the size of the colloidal particles and, generally speaking, it shifts to a longer wavelength region as the grain size increases. The transmission color of the gold colloidal solution changes as pale crimson or red color at about 60 nm, purple at about 90 nm and blue at about 120 nm of gold particles. As the grain size increases further, the coloring property decreases since the ratio of the surface area increases. The red-purple color of the gold colloid is particularly beautiful, which is referred to as purple of Cassius. Purple of Cassius has been used long since as pigments of pink, rose, or rhodamine purple, purple color and often used for the production of red glass using glass as a supports or ceramic pigments using kaolinite. They are extremely important for providing or exhibiting red or purple color as pigment for overglaze color.

Then, gold, silver and platinum colloids have been chemically produced long since by a reducing method of corresponding salts. Among them, the gold colloid is a typical colloid embellishing the history of colloid chemistry and there have been known a number of reducing methods for obtaining gold colloidal solutions. For example, by at first neutralizing an aqueous solution of tetrachloroauric acid ($H[AuCl_4]$) with potassium carbonate ($K_2CO_3$) and then adding formaldehyde (HCHO) as a reducing agent, a gold colloid in which fine gold particles of 8 to 9 nm are dispersed in a liquid is obtained while depending on the concentration of the initial aqueous solution of tetrachloroauric acid. The reducing reaction is considered as below.

$H[AuCl_4]+2K_2CO_3+H_2O \rightarrow Au(OH)_3+2CO_2+4KCl$ $2Au(OH)_3+K_2CO_3 \rightarrow 2KAuO_3+3H_2O+CO_2$ $2KAuO_2+3HCHO+K_2CO_3 \rightarrow 2Au+3HCOOK+H_2O+KHCO_3$ The gold colloid is used again as a (seed solution) for obtaining larger gold colloidal particles. By repeating such procedures, gold colloidal particles of various sizes are prepared. Gold colloid obtained by reducing with formaldehyde is referred to as formal gold. As the reducing agent, in addition to formaldehyde, an etheric solution of yellow phosphor, hydrogen peroxide ($H_2O_2$), carbon monoxide (CO), alcohol, and, further, liquid extracts of natural products such as tea or tobacco may also be used. Depending on the condition upon formation, various products such as of red, purple or blue colors can be obtained occasionally.

Silver colloid is prepared also by substantially the same reducing method. A diluted aqueous solution of silver nitrate ($AgNO_3$) with addition of a diluted aqueous solution of tannic acid is heated to 70 to 80° C., and a small amount of sodium carbonate ($Na_2CO_3$) is added little by little while stirring. Silver carbonate ($Ag_2CO_3$) formed in this course is reduced with tannic acid to yield metallic silver (Ag). This silver is present as a colloid in the solution and the solution exhibits a transparent brown color. In addition, according to the Carey-Lea method of obtaining a red silver colloid, precipitates of a deep blue color obtained through reduction by mixing a concentrated aqueous solution of silver nitrate with a mixed solution of citric acid and ferrous sulfate ($FeSO_4 \cdot 7H_2O$) are separated by filtration and then washed with distilled water. Then, a silver colloid exhibiting a red transmission color is leached as liquid filtrates. Since the transmission color of the silver colloid is different remarkably from yellow, red or blue to green depending on the grain size and the shape of the particles thereof, the color is not always blood red even according to the Carey-Lea method and generally it is an intense red color somewhat tinted with brown. In addition, as a method of preparing the silver colloid, a method of reducing a warm aqueous solution of silver oxide ($Ag_2O$) with carbon monoxide (CO) or hydrogen has been known. Further, as is well-known, a silver colloid dispersed in gelatin obtained by exposing a gelatin solution of silver nitrate or silver halide to light is used in photography.

Further, a platinum colloid is prepared simply by a method of adding sodium citrate to an aqueous solution of hexachloroplatinic acid ($H[PtCl_6]$) while boiling thereby reducing the same. In addition, of using a solution of mixing hexachloroplatinic acid and tetrachloroauric acid ($H[AuCl_4]$) at an optional ratio, a platinum-gold alloy colloid of a composition corresponding to the molar ratio thereof is obtained. Further, when an aqueous mixed solution of hexachloroplatinic acid and palladium chloride ($PdCl_5$) is used and reduced with sodium citrate in the same manner, a platinum-palladium alloy colloid can be prepared.

While various methods contained in many research papers based on the reducing method of instable noble metal compounds such as noble metal chlorides are different in view of the difference of reducing agent, pH and temperature during reaction, or presence or absence of protective colloid, the difference is not so essential. The purity of reagents to be used and the way of handling them often give effects, and individual methods have no such meanings as capable of expecting remarkable functions and effects.

Different from the foregoing chemical methods, various physical methods have been known. For example, a noble metal colloid or noble metal alloy colloid can be obtained also by dipping two electrodes made of a starting noble metal or alloy at a slight distance in a non-electrolyte liquid such as oil or pure water filled in a container externally applied with water cooling and generating arc discharge or spark discharge therebetween. The method is referred to a Bredig method or a spark erosion method.

As another physical method, a method of preparing fine metal particles of heating to evaporate a metal element in a rare gas atmosphere at 1 to 30 Torr (130 Pa to 4 kPa), and collecting fine metal particles generated as smokes, which is referred to as an in-gas evaporation method has been known (Nobuhiko Wada: in Solid Physics, separate volume, special number, Microfine Particles, p 57 (Agne technical Center, Tokyo, 1975). The heating method includes an ohmic heating method by a tungsten resistance heater, an electron beam heating method, an arc plasma heating method, a laser heating method, etc., and while fine particles manufacturing method corresponding respectively to them have been known, they are considered basically identical with each other. It has been reported that a metal colloid is produced by collecting fine particles of various metals or alloys containing noble metals or alloys prepared by the methods described above in an organic solvent just after the generation thereof and adding an appropriate protective colloid to stably disperse them in the organic solvent, which is formulated into a conductive ink used for electronic micro circuits.

While the chemical methods of using noble metal chlorides or noble metal nitrates have been used long since as described above and versatile delivational improved methods have been proposed, it was generally difficult to obtain a concentrated colloid by the methods. Further, they have a drawback that the starting chemicals are extremely expensive, various chemical wastes are generated in the course of production process to result in large environmental load. Such a drawback resulted difficulty in producing noble metal colloids by the chemical methods in the industrial scale under economical restriction.

While the spark erosion method of using the arc discharge is a method suitable to obtain a thin colloid, it is difficult to prepare a concentrated colloid system while preventing an aggregation. This is because addition of a surfactant is indispensable for stabilizing the concentrated colloid against an aggregation, but the surfactant is generally an electrolyte and effective spark discharge cannot be obtained easily.

On the other hand, while the in-gas evaporation method of the prior art is a method having high productivity, inexpensive and industrially excellent, it is difficult to make the grain size of fine particles uniform and has a drawback that fine particles tend to be agglomerate into a cluster. This is due to the principle of the in-gas evaporation method. That is, evaporated metal atoms are cooled by collision of rare gas molecules and associated to form fine particles but the generated fine particles are again associated to each other in a rare gas molecule atmosphere and fine particles tend to form chained clusters. Bonding between fine particles is mainly due to van der Waals force. Fine particles once forming formed clusters are difficult to be dispersed in a solvent as individual fine particle system by pulverizing clusters by applying a colloid chemical process such as addition of a protective colloid.

Under the situations as described above, the inventor of the present application has already proposed a method of manufacturing a metal colloid which is referred to as a method of continuous vacuum deposition on a surface-active liquid and has already obtained a patent right (Patent Documents 1 to 4).

That is, the series of patent techniques are methods developed for the synthesis of metal magnetic fluids and, as disclosed by the inventor in the patent specification, they are applicable to the manufacture of various metal or alloy colloids including noble metal colloids.

Figure 1:
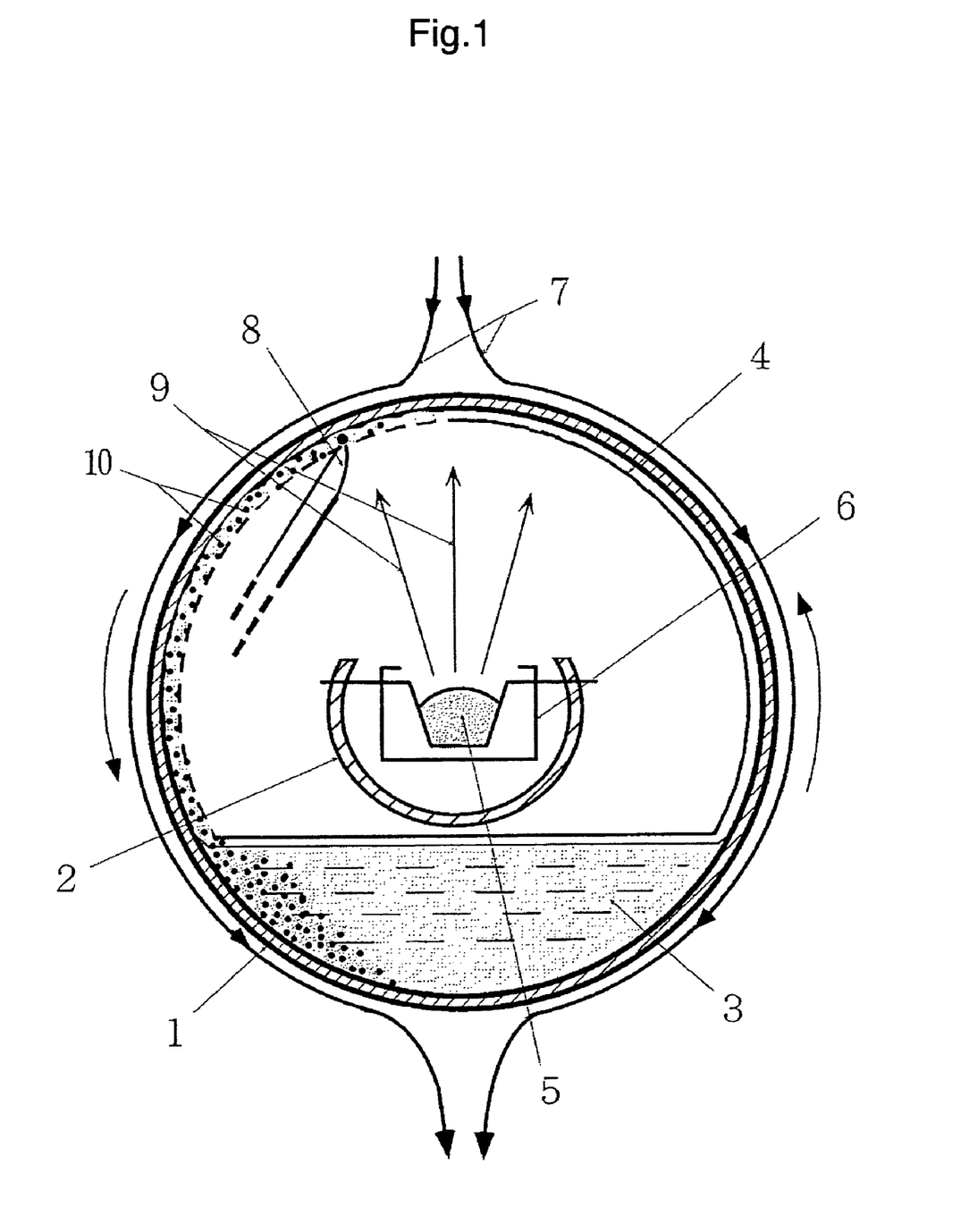
FIG. 1 is a schematic view for a method of the continuous vacuum deposition on a surface-active liquid.

The method is outlined as described below. As shown in FIG. 1, a vacuum vapor deposition vessel (1) is in a drum shape rotating around a fixed shaft (2) also serving as an evacuation tube. The entire drum-shaped vacuum vapor deposition vessel (1) is evacuated to a high vacuum through the fixed shaft (2). An oil (3) with addition of a surfactant is filled to the bottom of the drum and the oil containing a surfactant is drawn into a thin film on the inner wall surface of the drum as the rotation of the drum. An evaporation source (5) is fixed to the central shaft of the drum. The evaporation source (5) has a heat resistant crucible containing raw material lumps of a metal or alloy to be obtained, which is heated up to a temperature at which the metal is evaporated in the form of atoms by a tungsten resistance heater. Further, the evaporation source (5) is covered with a radiation heat shielding plate (6) for shielding the radiation while leaving the top portion. The outer wall of the rotary vacuum vessel (1) is entirely cooled by a water stream (7). Thermocouple (8) for measuring the temperature of the oil film (4) during operation is placed in contact with the inner wall of the rotary vacuum vessel (1) and move slidably along the inner wall of the vacuum vessel (1) along with rotation.

Metal atoms (9) evaporated in vacuum from the evaporation source (5) are condensed on the surface of the oil film (4) containing the surfactant to form fine metal particles (10), the generated fine metal particles (10) are transported along with rotation of the vacuum vessel (1) to the oil reservoir (3) of the vacuum vessel and, at the same time, a new oil film (4) is supplied to an upper portion of the vacuum vessel (1). By continuing the process, the oil (3) containing the surfactant at the bottom of the vacuum vessel changes into a fine metal particle colloid in which fine metal particles are dispersed at high concentration. What is important is the effect of the surfactant. Usually, when vacuum deposition is conducted on the pure oil surface, metal atoms are not deposited on the oil surface but most of them are reflected. However, in a case where the surfactant is incorporated in the oil, it is considered that the hydrophilic functional groups of the surfactant cover the surface of the oil, and the oil surface is modified so as to have depositability to the metal atoms and the metal atoms are deposited effectively. According to the experiment, about 80% or the flying metal atoms are deposited on the oil surface and condensed as fine particles. The next important effect of the surfactant is that the surface of fine particles are covered with the surfactant molecules at the same time with the formation of the fine metal particles to prevent the coagulation of fine particles to each other and growing larger, whereby the fine particles are well dispersed in the oil while keeping the size just after generation of the fine particles.

In a case of using an alloy as the evaporation source, fine alloy particles having the composition reflecting the vapor pressure of the alloy ingredients are obtained but the alloy composition in the fine particles is different greatly from the composition of the starting alloy.

By the method described above, fine particle colloids with a diameter of 2 to 3 nm are prepared for metals or alloys of a relatively high melting point such as Fe, Co, Ni, Cr, Ge, Pd, Pt, and Fe—Co alloy. On the other hand, fine particle colloids with a diameter of from 5 to 9 nm are prepared for metals and alloys of low melting point such as Zn, Cu, Ag, Au, In, and Sn.

As has been described above, the method of the continuous vacuum deposition on a surface-active liquid is a method capable of efficiently producing colloids containing fine metal particles with the smallest grain size at high concentration, without the agglomeration and in a simple process.

Further, since the yield of the starting metal is high, it is excellent also in economic efficiency as a method of preparing expensive noble metal colloids.

Patent Document 1: JP No. 1374264
Patent Document 2: JP No. 1348706
Patent Document 3: JP No. 1716879
Patent Document 4: JP No. 1725153

DISCLOSURE OF THE INVENTION

While the method of the continuous vacuum deposition on a surface-active liquid as described above developed by the inventor of the present application is a characteristic and useful method, noble metal or alloy colloids manufactured by the method did not show coloration inherent to noble metal colloids but were pure black being referred to as metal black. Therefore, the noble metal colloids prepared by the method could not be used so far as pigments.

Further, for use as a conductive ink or conductive paste, a porosity has to be minimized in order to lower the electric resistance of a circuit pattern after baking. However, the conductive ink or conductive paste manufactured by the method described above had a remarkable drawback that the porosity was large after baking.

Further, since the dispersion medium for the metal or alloy colloids was restricted to alkylnaphthalene, i.e., high boiling oils, they had a property not dried easily even by heating. Accordingly, it was not suitable to a case of utilizing as a pigment, as well as to an application use requiring rapidly drying property in forming a thin film circuit on a substrate by way of printing, drying and, successively, sintering process of circuit patterns as in the conductive ink or the conductive paste.

In view of the background as described above, the invention of the present application has a subject of providing a novel pigment, a conductive paste material and a conductive ink material for printed substrate of electronic parts, etc. while taking the advantage of the continuous vacuum deposition on a surface-active liquid as described above developed by the inventor, and showing coloration inherent to the metal colloids while solving the problems therein.

The next problem in the prior art is that fine metal particle colloids are mainly fine particle colloids of elemental metals, and the kinds of the fine alloy particle colloids are extremely restricted. Production of fine alloy particles is generally difficult and methods of adding a reducing agent such as aldehyde (RCHO in which R represents H, $CH_3$, etc.), hypophosphite or hypoborite to an aqueous mixed solution or polyhydric alcohol solution of different kinds of metal salts, and heating them thereby reducing each of the metal salts simultaneously to generate fine alloy particles in the solution have been conducted for the chemical production process at a laboratory level. However, it is generally not easy to reduce two kinds of metal salts containing metal ions of different standard electrode potentials simultaneously to precipitate them as alloy solids, and only the fine alloy particles of extremely restricted kinds, such as Ni—Co series alloys, Au—Ag series alloys, Pt—Au series alloys, Pt—Pd series alloys, etc. could be obtained so far. On the other hand, also in the physical method such as the in-gas evaporation method of using arc plasma or induction heating, or the active liquid surface continuous vacuum vapor deposition method, each of the ingredient metal components of the alloy used as the raw material usually has a vapor pressure different by an order of magnitude or more and show a strong fractionating effect that one of the elements at higher vapor pressure evaporates preferentially. Accordingly, fine alloy particles of an aimed determined constant composition were difficult to be obtained. Only the report, on the Fe—Co series fine alloy particle colloids has been reported so far.

The invention of the present application has been achieved based on the result of the study made by the inventor as will be described below for solving the subject described above.

That is, the inventor has made an earnest study on the phenomenon that most of metal or alloy colloids manufactured by the method of continuous vacuum deposition on a surface-active liquid always exhibit intense black color irrespective of the kinds of the metal or alloy colloids. As a result, it has been found that while the metal colloids exhibit the intense coloration because they absorb light at specified wavelength among the visible ray by plasma resonance absorption, since the width of the absorption band is in inverse proportion to the diameter of fine grains, fine particles absorb the entire region of the visible light range and, as a result, exhibit the intense black color irrespective of the kinds of the metals. Further, it has been found that the void ratio after baking depends on the metal colloidal grain size used for the raw material ink in the conduction ink or the conduction paste, and that when the colloidal grain size of the raw material ink is extremely small, it provides a merit that the baking temperature may be lowered but, on the other hand, this results in large void ratio. Accordingly, for controlling the tone in the noble metal colloidal pigments and properly controlling the void ratio after baking and the baking temperature in the conductive ink or the conductive paste, it was necessary to properly increase the diameter of fine particles of metal/alloy colloids and control them. It has been also found that it is desirable to replace the dispersion medium of less volatile alkyl naphthalene with rapid drying solvents.

Further, the inventor has found that fine metal particle colloids lose the stability, particles are fused to each other and grown to increase the volume about by ten times when uniformly mixing two kinds of fine metal particle colloids prepared by the method of the continuous vacuum deposition on a surface-active liquid described previously and applying a heat treatment at an appropriate temperature and also found that alloying occurs simultaneously between different kinds of metals.

Then, the application provides the following inventions for solving the subjects described above.

[1] A fine metal particle colloidal solution in which fine metal particles are dispersed as those having an average grain size of 10 nm or more by fusion or aggregation.

[2] The fine metal particle colloidal solution described above, wherein fine metal particles with an average grain size of less than 10 nm are fused or aggregation and dispersed.

[3] A metal particle colloidal solution exhibiting a black color.

[4] A fine metal particle colloidal solution exhibiting coloration other than black color.

[5] The fine metal particle colloidal solution described in any one of the above wherein the fine metal particles are fine particles of one or more of metals or alloys.

[6] A fine metal particle colloidal solution wherein the fine black metal particle colloidal solution is heat treated to exhibit coloration.

[7] A fine metal particle colloidal solution as descried in [6] above, wherein a colloidal solution of fine metal particles with an average grain size of less than 10 nm is applied with a heat treatment.

[8] A fine metal particle colloidal solution as descried in [6] or [7] above, wherein it is heat treated at a temperature of 150° C. or higher.

[9] A fine metal particle colloidal solution as descried in any one of [6] to [8], wherein fine particles with an average grain size of 10 nm or more are dispersed to exhibit coloration.

[10] A metal particle colloidal solution as descried in any one of [6] to [9], wherein the fine metal particles are one or more of fine metal or alloy particles.

[11] A metal particle colloidal solution in which a mixed colloidal solution where two or more of different fine metal particles are dispersed is applied with a heat treatment, and the formed fine alloy particles are dispersed.

[12] A fine metal particle colloidal solution as described in [11], wherein it is heat treated at a temperature of 150° C. or higher.

[13] A fine metal particle colloidal solution as descried in any one of [6] to [12], wherein the colloidal solution in which fine metal particles are dispersed by evaporation under vacuum in an oily solvent containing a surfactant is applied with a heat treatment.

[14] A fine metal particle colloidal solution as descried in [13], wherein replacing treatment with other kind of oily solvent is applied after the heat treatment.

[15] A fine metal particle colloidal solution as descried in [13], wherein the replacing treatment is applied with an water-soluble solvent after the heat treatment.

[16] A metal colloidal pigment, a conductive paste material or a conductive ink which comprises the colloidal solution described in any one of [1] to [15] as at least a portion of the constitution thereof.

[17] A metal colloidal pigment, a conductive paste material or a conductive ink which is prepared with the colloidal solution described in any one of [1] to [15].

[18] A process for producing a fine metal particle colloidal solution comprising applying a heat treatment to a fine black metal particle colloidal solution to develop coloration.

[19] The process for producing a fine metal particle colloidal solution according to claim 18 comprising applying the heat treatment to the solution of fine metal particle colloidal solution with an average grain size of less than 10 nm.

[20] The process for producing a fine metal particle colloidal solution according to claim 18 or 19 comprising applying the heat treatment at a temperature of 150° C. or higher.

[21] The production process for a metal particle colloidal solution as described in any one of [18] to [20], wherein the fine metal particles are fine particles of one or more metals or alloys.

[22] A process for producing a metal particle colloidal solution comprising applying a heat treatment to a mixed colloidal solution to which two or more different kinds of fine metal particles are distributed, and forming a colloidal solution where the formed fine alloy particles are dispersed.

[23] A production process for a fine metal particle colloidal solution as described in [22], wherein colloidal solutions formed by dispersing fine particles of two or more of different kinds of metals respectively are mixed to form a mixed colloidal solution.

[24] A production process for a fine metal particle colloidal solution as described in [22], wherein fine particles for each of two or more different kinds of metals are dispersed successively to form a mixed colloidal solution.

[25] A production process for a fine metal particle colloidal solution as described in any one of [18] to [24], wherein the colloidal solution in which fine metal particles are dispersed by evaporation under vacuum in an oily solvent containing a surfactant is applied with a heat treatment.

[26] A production process for a fine metal particle colloidal solution as described in [25], wherein a replacing treatment with other kind of oily solvent is applied after the heat treatment.

[27] A production process for a fine metal particle colloidal solution as described in [25], wherein the replacing treatment is applied with an aqueous solvent after the heat treatment.

[28] A production process for a metal colloidal pigment, a conductive paste material or a conductive ink which comprises the colloidal solution produced by the process described in any one of [19] to [27] as at least a portion of the constitution thereof.

[29] A production process for a metal colloidal pigment, a conductive paste material or a conductive ink which is prepared with a colloidal solution produced by the method as described in any one of [18] to [27].

REFERENCES IN THE DRAWINGS SHOW THE FOLLOWINGS 1 rotary vacuum vessel
2 fixed shaft
3 oil with addition of surfactant and fine metal particle colloid
4 thin film of oil containing surfactant
5 evaporation source
6 radiation heat shielding plate
7 cooling water stream
8 thermocouple
9 evaporated metal atoms
10 fine metal particles
11 heat processing vessel
12 stirring propeller
13 motor
14 rare gas
15 electric heating wire
16 sand bath
17 thermocouple
18 reservoir
19 cooling water
20 condensator
21 exhaust gas

BEST MODE FOR CARRYING OUT THE INVENTION

The invention of the present application has the features as described above and embodiments thereof are to be described below.

In the invention of the application, the fine metal particle colloidal solution described above is at first provided and the fine metal particle colloidal solution is a fine metal colloidal solution exhibiting coloration of black or other color than black as a solution of an oil-soluble solvent or water-soluble solvent in which the fine metal particles are dispersed as those with an average size of 10 nm or more by fusion or agglomeration.

"Black color" herein means a color so-called metal black. Coloration inherent to the fine metal colloid is exhibited in the invention of the application.

More preferably, it has a feature in that fine metal particles with an average grain size of less than 10 μm are dispersed by fusion or agglomeration. The fine metal particle means herein fine particles of one or more of metals or alloys.

Alternatively, the fine metal particle colloidal solution of the application has a feature in that fine black metal particle colloidal solution is heat treated as a solution of an oil-soluble or a water-soluble solvent to develop coloration.

Also in this case, it is preferably taken into consideration that the fine metal particle colloidal solution with an average grain size of less than 10 nm is heat treated, they are heat treated at a temperature of 150° C. or higher, and fine particles with an average grain size of 10 nm or larger are dispersed to develop coloration.

The colloidal solution according to the invention of the application as described above can be produced easily in accordance with the method of the continuous vacuum deposition on a surface-active liquid as described above developed by the inventor of the application or a modified method thereof.

For example, the fine metal particle colloidal solution according to the invention of the application is produced by applying a heat treatment to a colloidal solution in which fine metal particles are dispersed by evaporation with vacuum in an oil-soluble solvent containing a surfactant.

Then, the colloidal solution according to the invention of the application may be subjected to a replacing treatment with other kind of solvent in accordance with the performance, characteristics and, further, application uses. In this case, process of precipitating and redispersing colloidal particles or various other means may be adopted.

Figure 2:
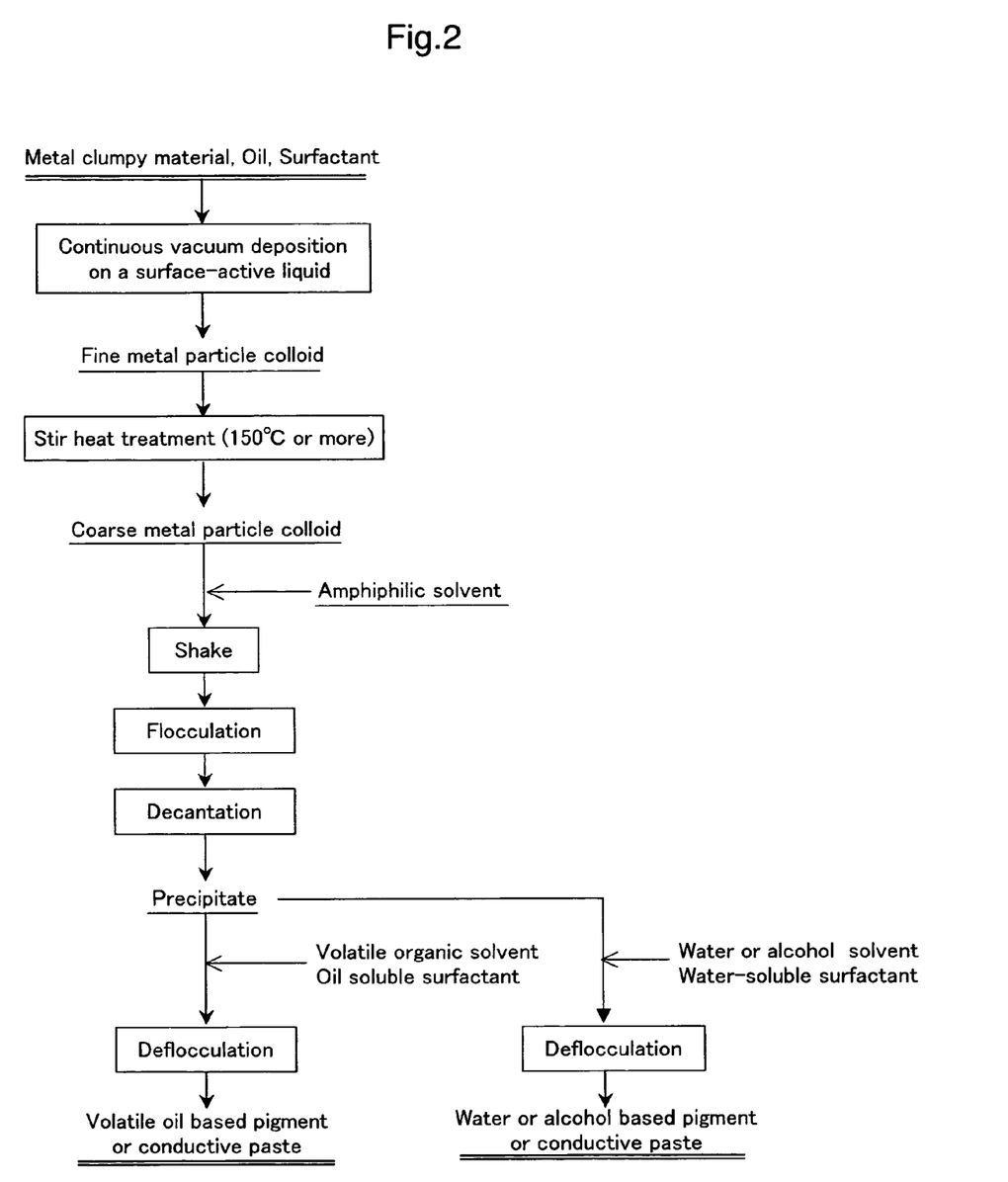
FIG. 2 shows a process chart for producing a metal colloidal pigment, a conductive paste, and a conductive ink.

Referring further to the invention of the application for one of preferred embodiments, appended FIG. 2 is a process chart showing a production process using fine particle colloid produced by the method of the continuous vacuum deposition on a surface-active liquid as a raw material, and constituted for properly increasing the diameter of the fine particles and dispersing them while replacing the base oil with other volatile solvent. At first, fine metal particle colloid produced by the method of the continuous vacuum deposition on a surface-active liquid is transferred to a colloid heat treatment apparatus to be described later and heated up to a temperature at about 150° C. or higher for a predetermined time in a rare gas atmosphere. At a temperature of 150° C. or higher, the protective effect of the surfactant is lost, the dispersibility of the particle system becomes instable and it changes into easily flocculating form. As a result, the fusion growing due to collision between fine particles to each other is accelerated and the size of the fine particle is increased. Simultaneously, the number density of the fine particles is decreased. While the heating temperature and the heating time are properly controlled in accordance with the kind of the metal and the aimed fine particle size, the heat treatment is generally conducted preferably within a range from 200 to 260° C. for metals of high melting points such as Fe, Co, Ni, Cr, Ge, Pd, Pt, and Fe—Co alloy, from 150 to 200° C. for metals of low melting point such as Zn, Cu, Ag, Au, In, and Sn, for about 60 min or more for each of the cases. After completing the heat treatment, when the colloid is cooled to a room temperature, the protective effect of the surfactant is restored and the colloid is again dispersed stably. As described above, coarse metal particle dispersed colloid of an aimed grain size is obtained. In this stage, the noble metal colloid exhibits beautiful coloration in accordance with the grain size. When an amphiphilic solvent is added in an amount equal with the colloid is added to the colloid and shaken, the colloid is separated from the solvent and settled. The process is referred to as flocculation. The supernatants can be discarded to obtain cake-like precipitates by using a gravitational settling and, optionally, centrifugal separation method. The process is referred to as decantation. As the amphiphilic solvent, acetone ($2(CH_3)CO$), dioxane ($C_4H_8O_2$), etc. are suitable.

Finally, the cake-like precipitates can be deflocculated as they are, for example, by addition of an appropriate volatile oil, for example, petroleum benzine, hexane and other lower alkanes or lower alkenes to obtain a volatile oil based metal colloid as a final product. On the other hand, by properly adding a water-soluble surfactant further for obtaining a hydrophilic solvent based metal colloid, they can be deflocculated and dispersed in a hydrophilic solvent such as water or alcohol. The ratio of each of the solvents added to the precipitates is properly controlled in accordance with the viscosity and the density of the pigment, conductive paste, or conductive ink, etc. conforming the purpose of using the colloid.

Figure 3:
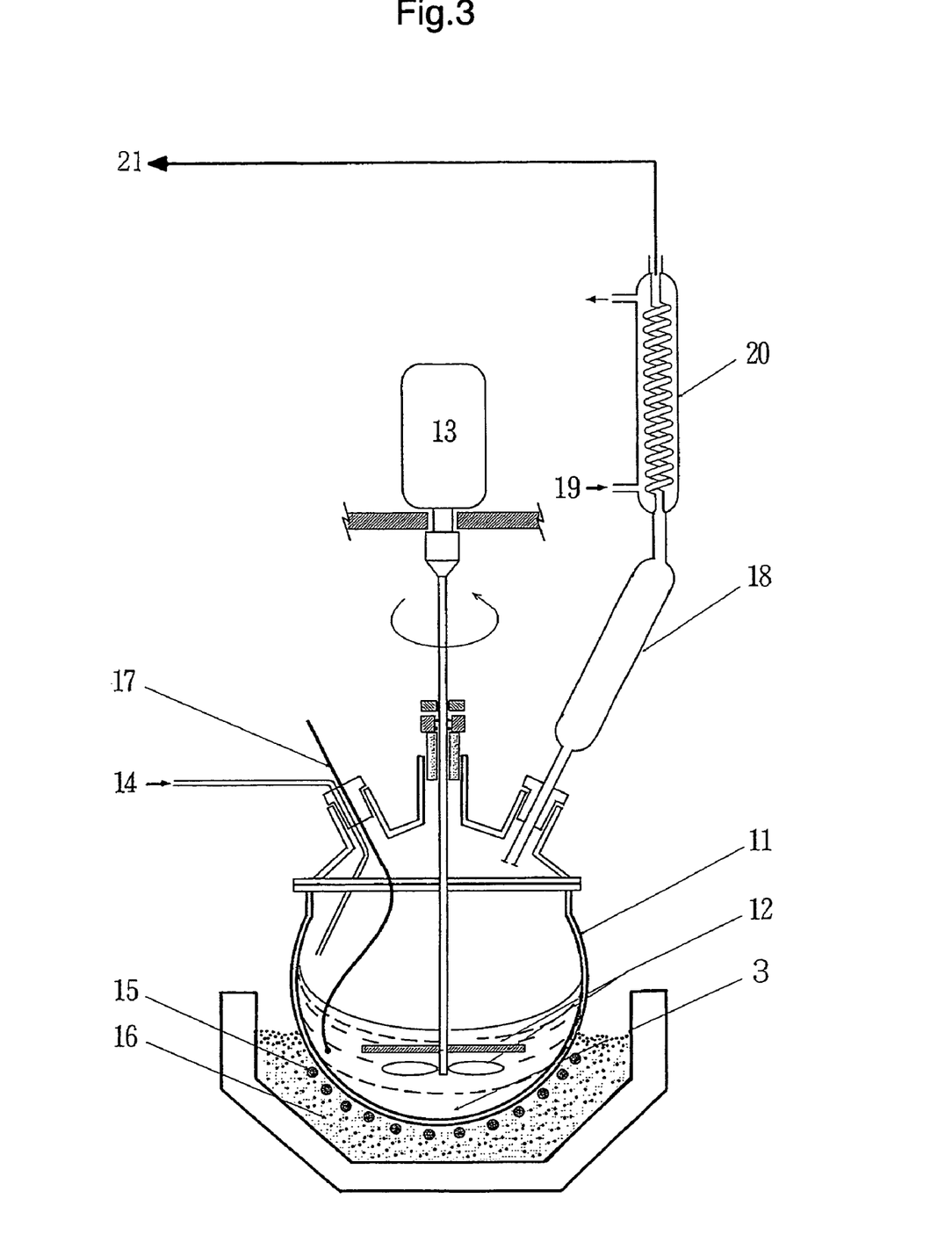
FIG. 3 is a schematic view for a stirring heat treatment device of a metal colloid.

FIG. 3 is a schematic view of a stirring heat treatment apparatus for reasonably practicing the stirring heat treatment process. It has a structure of heating a fine metal particle colloid (3) as the starting material prepared by the method of the continuous vacuum deposition on a surface-active liquid and transferred to a heat treatment vessel (11) by an electric heating wire (15) and a sand bath (16) while stirring by a stirring propeller (12) and a motor (13) for driving the same. The heat treatment vessel (11) may be made of either metal or glass and this is parted into a body and a lid and both of them are joined airtightly. Stirring is effected while introducing a rare gas (14) from a rare gas introduction tube, and the temperature of the colloid is detected by thermocouple (17) and kept at a predetermined temperature. Oil vapors generated in the course of the heat treatment is transported by the rare gas (14) and transferred by way of a reservoir (18) and a condenser (20) cooled by cooling water (19) and transported to the outside of the system as an exhaust gas (21). High boiling ingredient vapors of the oil are condensed in the condenser (20), refluxed to the heat treatment vessel (11) and only the low boiling ingredients of the oil are discharged as an exhaust gas (21).

Referring more specifically to a fine particle colloidal solution and a preparation method thereof, two kinds of fine metal particle colloids prepared, for example, by the method of the continuous vacuum deposition on a surface-active liquid are transferred at a predetermined ratio in accordance with the alloy composition to a glass vessel of the heat treatment apparatus shown in FIG. 3 and when it is applied with a heat treatment at an appropriate temperature, the fine metal particle colloid loses the stability and particles are fused to each other and grown to cause alloying. As a result of experiment conducted to various alloy systems and at a various ratios for each of the systems, it has been found that alloying is attained substantially in accordance with the equilibrium phase diagram generally known so far. According to the method, as alloy systems, Fe—Ni, Fe—Co, Ni—Co, Au—Cu, Au—Ag, Au—Ge, Au—Ni, Au—Pd, Au—Sn, Ag—Ge, Ag—In, Cu—Sn, Cu—Ni, Cu—Cr, Ni—Cr, Ni—Ga, Ni—Pd, Fe—Si, Si—Sn, Si—Ge, and Si—Au can be prepared. This is also applicable in ternary or further multinary alloy systems containing any of them. Further, as different preparing methods of mixed colloid as the starting material, the following methods are shown specifically. That is, fine alloy particle colloid substantially in accordance with the equilibrium phase diagram is prepared by (1) preparing each of colloids for metal species to be alloyed and then mixing them, or (2) vacuum depositing a kind of metal species to prepare fine particle colloid of the metal, successively, loading a second metal to be alloyed therewith to an evaporation source, vacuum depositing the second metal in the same manner by an amount corresponding to the aimed alloy composition, preparing a mixed colloid in one vacuum vessel, and then applying a heat treatment by using the mixed colloid. The latter method (2) is excellent over the former method (1) in view of the productivity and the economicity since the mixing step can be saved. On the other hand, the former method (1) is excellent compared with the latter method (2) in view of versatility and controllability since a plurality kinds starting material of fine metal particle colloid can be formulated at an optional ratio.

The metal colloidal pigment according to the invention of the application is used mainly as a colorant and used in the form being dispersed in water, organic solvent, synthetic resin, oils, etc. The pigment is generally classified into organic pigments and inorganic pigments, and the noble metal colloid belongs to the former. Particularly, gold colloid exhibits a beautiful red-purple color referred to as Cassius purple and has been utilized long since as an ornamental pigment or an infrared reflective coating material. Further, the noble metal colloidal pigment is used as fillers, reinforcing agents, anti-rusting materials in addition to coloring agents in the same manner as usual inorganic pigments.

Further, the metal colloid according to the invention of the application is used as, formation of fine wirings for liquid crystal panels or for plasma displays, formation of microfine wirings of other electronic circuit substrates, formation of fine electrodes and correcting wiring defects. That is, fine conductive circuits can be manufactured at a high efficiency and at a reduced cost by coating the conductive paste or conductive ink according to the invention by printing or coating by means of a screen printing method, an ink jet printing method or a spin coating method, drying, and successively, baking under heating on circuit substrates In addition, the gold colloid is used as a carrier for supporting and administrating pharmaceutical chemicals and the colloid of platinum, palladium and an alloy thereof is utilized as a catalyst for generating hydrogen by photolysis of water, or utilized as a catalyst for decomposing reaction of hydrogen peroxide and it has been known that the platinum catalyst in the colloidal state has an outstandingly higher activity compared with pelleted or powdery platinum catalyst.

Examples are shown below and described more specifically. It will be apparent that the invention is not restricted to the following examples.

EXAMPLE

Example 1

Preparation of Octane-based Gold Colloidal Pigment

An alkylnaphthalene based gold colloid was prepared by the method of continuous vacuum deposition on a surface-active liquid shown in FIG. 1 using 150 cc of 5% alkylnaphthalene solution of succinic acid polyamine imide as a base solution and about 30 g of bulky gold as an evaporation material. The succinic acid polyamine imide is a dispersant and the alkylnaphthalene is a dispersion medium. About 70% of the gold metal charged in the evaporation source is effectively taken into the solution and the concentration of the gold dispersion phase is about 12%. The obtained gold colloidal particle has a uniform size of about 5 nm and the density of the number of particles is $1.4 \times 10^{17}$/cc. In this stage, the gold colloid does not exhibit clear coloration but is black like India ink. Then, the entire amount of the gold colloid is transferred to the stirring heat treatment apparatus shown in FIG. 3 and heated at 200° C. for 30 min while stirring in an argon gas atmosphere. After heat treatment, fine gold particles are fused and grown to an average grain size of about 20 nm and dispersed stably with no flocculation in the solvent, and the colloidal solution exhibits red-purple color. Successively, acetone is poured by about ⅓ volume and when stirring is continued, the colloid causes flocculation and precipitates. When the process is repeated twice while discarding supernatants, only the cake-like solid ingredients can be taken out. When octane ($C_8H_{18}$) is added by three times amount to the cake and shaken, the gold colloidal particles are dispersed again to get fluidity and octane based gold colloidal pigment exhibiting clear red-purple color is obtained. Instead of octane, petroleum benzine, kerosene, volatile hydrocarbon oils (alkanes), unsaturated hydrocarbon oils (alkene), etc. can also be used. When the stirring heat treatment temperature is at 160° C., the transmission color of the obtained gold colloidal pigments is purple-tinted red and, on the other hand, at a stirring heat treatment temperature of 240° C., it exhibits blow purple color. The obtained color tone can be controlled by properly selecting the heat treatment temperature and the time.

Example 2

Preparation of Octane-based Silver Colloidal Pigment

An octane-based silver colloidal pigment can also be prepared by the same process as for the gold colloidal pigment in Example 1. The silver colloid obtained by the active liquid surface continuous vacuum vapor deposition method has an average grain size of about 7 nm and, when prepared at an identical ratio of starting materials as with that in Example 1, while the concentration of the silver dispersion phase is also about 12%, the density of the number of particles is $5.7 \times 10^{16}$ N/cc. The appropriate condition for the stirring heat treatment is at 160 to 220° C. for 30 min. Along with increase in the stirring heat treatment temperature, the grain size of the silver colloid increases to 15 to 50 nm and, at the same time, obtained color tone changes variously. At the heat treatment temperature of 160° C., 200° C., and 220° C., silver colloidal pigments of pink, red-purple and blue purple colors are obtained respectively. The color tone can be controlled properly within a wide range in accordance with the purpose of use by controlling the heat treatment temperature.

Example 3

Water-based Silver Colloidal Conductive Paste and Conductive Ink

The process for obtaining cake-like fine silver particle precipitates is identical with the production process for the octane-based silver colloidal pigment of Example 2. An aqueous 10% solution of dodecyl benzene sulfonate is added to the cake-like fine silver particle precipitates in an amount three times as much as the fine silver particle precipitates and they are shaken under stirring by which precipitates are flocculated to obtain highly fluidizing water-based silver colloidal paste. Further, when the aqueous solution described above is added by 5 to 10 times amount, the viscosity is further lowered and a water-based silver colloidal conductive ink suitable to ink jet printing or the like can be produced. The color tone is black having metallic luster. It is also possible to produce an alcohol-based rapidly drying silver colloidal conductive ink by using ethyl alcohol ($C_2H_5OH$) or isopropyl alcohol ($C_3H_7OH$) instead of the aqueous solution.

Example 4

Octane-based Nickel Colloidal Conductive Paste

An octane-based nickel colloidal conductive paste can also be produced by the same process as for the gold colloidal pigment of Example 1. The nickel colloid obtained by the method of the continuous vacuum deposition on a surface-active liquid has an average grain size of about 2 nm and, when prepared at the same ratio of starting materials as in Example 1, while the concentration of nickel dispersion phase is also about 12%, the density of the number of particle is $4.5 \times 10^{18}$/cc. An appropriate condition of the stirring heat treatment condition is at 260° C. for 30 min, by which the grain size of the nickel colloid particle increases to about 30 nm. The obtained color tone is black. When octane ($C_8H_{18}$) is added to the cake in about three times amount and shaken, the nickel colloidal particles are dispersed again and nickel colloidal conductive paste having smooth fluidity can be prepared. The viscosity and the particle density can be controlled by properly selecting the ratio of the octane added. Addition of the succinic acid polyamine imide as the dispersant additionally is also effective for the improvement of the fluidity.

Example 5

Fine Nickel-palladium Alloy Particle Colloid

Fine nickel-palladium alloy particle colloid is prepared by the method of the continuous vacuum deposition on a surface-active liquid shown in FIG. 1 using 150 cc of 10% alkylnaphthalene solution of succinic acid polyamine imide as a base solution and about 20 g of bulky nickel as an evaporation material. Then, fine palladium particle colloid is prepared in the same manner using the base liquid of the same composition and about 20 g of clumpy palladium as the evaporation material. Then, each of the colloidal solutions is transferred by an equal amount to the metal colloid stirring heat treatment apparatus shown in FIG. 3 and stirring heat treatment is effected for about one hour in an argon gas atmosphere at 220° C. When they were cooled as they are, the dispersion stability is restored to obtain a fine nickel-palladium alloy particle colloid of a uniform composition. Further, the shape and the crystal structure for each fine particle is measured by electron beam probe microanalysis (EPMA) using a microbeam electron microscope and compositional analysis was conducted for fine particles individually and the alloy composition and scattering thereof are demonstrated. As a result, all the measured fine particles have a face-centered-cubic lattice (FCC) structure and show a composition of 50 at. % Ni—Pd. Scattering of the composition on individual fine particles is not observed within a range of the measuring accuracy.

INDUSTRIAL APPLICABILITY

Starting from the metal clumpy material, a metal colloidal pigment can be produced at a high material yield, at a reduced cost in a great amount. Further, a metal colloid of high concentration can be produced easily. Further, since colloidal particles of a uniform grain size can be obtained, coloration is clear when used as a pigment. Further, since the grain size can be controlled in a wide range, the color tone can be controlled for a wide range and those of red-purple and purple color for the gold colloidal particle in view of the transmission color and those of yellow, red and red-purple color in view of the transmission color for the silver colloidal pigment can be produced respectively. Further, colloidal pigments in volatile oily solvents such as petraleum benzine, various esters, alkanes (paraffins) ($C_nH_{2n+2}$), alkenes ($C_nH_{2n}$), cyclohexane ($C_6H_{12}$), etc. and colloidal pigments in hydrophilic solvent such as water, various alcohols and various fatty acids can be produced in accordance with the respective application uses. In the same manner, it is also possible to produce platinum colloidal catalyst and palladium colloidal catalyst having various solvents suitable to the reaction systems.

Then, as the conductive paste or the conductive ink material, conductive pastes or conductive inks of copper, nickel, copper-aluminum alloy, copper-nickel alloy, silver-copper alloy, gold-copper alloy colloids, can be produced at a high material yield, inexpensively and efficiently in addition to the conductive paste or the conductive ink of gold, silver and platinum colloids. Further, they can be produced while controlling the volatility of the solvent, the baking temperature and the viscosity in accordance with the respective application uses. Further, metal and alloy colloids of various types such as colloids of indium, tin and alloys containing them at low baking temperature, as well as chromium colloid or iron colloid can be produced.

The remarkable function and effect of this method are that wastes generated in the production steps are minimized compared with the prior art. Further, wastes of organic solvents can be used by recycling.

The invention claimed is:

1. A process for producing an alloy particle colloidal solution which comprises the steps of mixing two or more of fine metal colloidal solutions in which metal particles having an average grain size of less than 10 nm are dispersed in a solvent and metals are different, applying a heat treatment within a range from 150 to 260° C. to a mixture of the fine metal colloidal solutions, and producing an alloy particle colloidal solution in which coarse alloy particles having an average grain size of 10 nm or more are dispersed in a solvent and the alloy consists of the metals.

2. The process for producing an alloy particle colloidal solution according to claim 1, wherein replacement treatment of a solvent is applied after heat treatment.

* * * * *